US009515627B2

(12) United States Patent
Li (10) Patent No.: US 9,515,627 B2
(45) Date of Patent: Dec. 6, 2016

(54) DEVICES AND METHODS FOR AUDIO VOLUME ADJUSTMENT (71) Applicant: Tencenet Technology (Shenzhen) Company Limited, Shenzhen (CN)

(72) Inventor: Cheng Li, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 110 days.

(21) Appl. No.: 14/594,281

(22) Filed: Jan. 12, 2015

(65) Prior Publication Data

US 2015/0117676 A1 Apr. 30, 2015

Related U.S. Application Data (63) Continuation of application No. PCT/CN2014/083678, filed on Aug. 5, 2014.

(30) Foreign Application Priority Data

Aug. 19, 2013 (CN) .......................... 2013 1 0362154

(51) Int. Cl.
*H03G 3/20* (2006.01)
*H04M 1/60* (2006.01)
*H03G 3/32* (2006.01)

(52) U.S. Cl.
CPC ................. *H03G 3/20* (2013.01); *H03G 3/32* (2013.01); *H04M 1/6016* (2013.01)

(58) Field of Classification Search
None
See application file for complete search history.

(56) References Cited

U.S. PATENT DOCUMENTS

| | | | | |
|---|---|---|---|---|
| 5,666,426 A * | 9/1997 | Helms | ...................... | H03G 3/32 381/104 |
| 6,298,247 B1 * | 10/2001 | Alperovich | ......... | H04M 1/6008 455/355 |
| 7,469,051 B2 * | 12/2008 | Sapashe | ................... | H03G 3/32 379/392.01 |
| 7,756,280 B2 * | 7/2010 | Hsieh | ...................... | H03G 3/32 381/107 |
| 8,422,700 B2 * | 4/2013 | Chen | ....................... | H03G 3/32 381/104 |

(Continued)

FOREIGN PATENT DOCUMENTS

| | | | | |
|---|---|---|---|---|
| CN | 101005588 A | | 7/2007 | |
| CN | 102118665 A | * | 7/2011 | ............... H04R 3/00 |

OTHER PUBLICATIONS

Patent Cooperation Treaty, International Preliminary Report on Patentability, issued Feb. 23, 2016, in PCT/CN2014/083678.

(Continued)

*Primary Examiner* — Brenda Bernardi
(74) *Attorney, Agent, or Firm* — Jones Day (57) ABSTRACT Systems, devices and methods are provided for audio volume adjustment. For example, a noise volume level of current ambient noise and a first volume level of a first current audio signal of a first application are acquired using a sound collecting device. The first volume level and the noise volume level are compared using one or more data processors to obtain a first comparison result. The first volume level is adjusted based on at least information associated with the first comparison result and a reference volume level.

8 Claims, 7 Drawing Sheets (56) References Cited

U.S. PATENT DOCUMENTS

| | | | |
|---|---|---|---|
| 2008/0153537 A1* | 6/2008 | Khawand | H03G 3/32 455/550.1 |
| 2011/0095875 A1* | 4/2011 | Thyssen | G09G 5/10 340/407.1 |
| 2012/0087516 A1* | 4/2012 | Amin | H03G 3/32 381/107 |
| 2013/0128119 A1* | 5/2013 | Madathodiyil | H04N 21/4852 348/563 |
| 2013/0287215 A1* | 10/2013 | Kim | H04M 1/6016 381/57 |
| 2014/0169587 A1* | 6/2014 | Wang | H03G 3/32 381/107 |

OTHER PUBLICATIONS

Patent Cooperation Treaty, The International Search Report and The Written Opinion of the International Searching Authority, mailed Nov. 26, 2014, in PCT/CN2014/083678.

\* cited by examiner

DEVICES AND METHODS FOR AUDIO VOLUME ADJUSTMENT

CROSS-REFERENCES TO RELATED APPLICATIONS

This application is a continuation of International Application No. PCT/CN2014/083678, with an international filing date of Aug. 5, 2014, now pending, which claims priority to Chinese Patent Application No. 201310362154.0, filed Aug. 19, 2013, both applications being incorporated by reference herein for all purposes.

BACKGROUND OF THE INVENTION

Certain embodiments of the present invention are directed to computer technology. More particularly, some embodiments of the invention provide systems and methods for signal processing. Merely by way of example, some embodiments of the invention have been applied to audio volume adjustment. But it would be recognized that the invention has a much broader range of applicability.

With the development of terminal technology, terminals, such as a mobile phone and a tablet personal computer, with audio playing functions have are widely used. Different users often prefer different audio volumes when using audio applications, such as music and videos. Volume adjustment becomes important for further development of terminal technology. Currently, a user often needs to manually press a volume control key or a volume control bar of a terminal for volume adjustment. The terminal adjusts system audio volume according to user operations on the volume control key or the volume control bar. Usually, every application on the terminal has a same audio volume after the volume adjustment.

The above-noted conventional technology has some disadvantages. For example, as the user often needs to manually press the volume control key or the volume control bar of the terminal for volume adjustment, the terminal does not adjust the volume if the user cannot manually press the volume control key or the volume control bar, which results in some inconvenience. In addition, as the system volume is uniformly adjusted, audio signals of all applications on the terminal are played at a same volume in any environment, which results in inflexibility and negatively affects volume adjustment effects.

Hence it is highly desirable to improve the techniques for audio volume adjustment.

BRIEF SUMMARY OF THE INVENTION

According to one embodiment, a method is provided for audio volume adjustment. For example, a noise volume level of current ambient noise and a first volume level of a first current audio signal of a first application are acquired using a sound collecting device. The first volume level and the noise volume level are compared using one or more data processors to obtain a first comparison result. The first volume level is adjusted based on at least information associated with the first comparison result and a reference volume level.

According to another embodiment, a device is provided for audio volume adjustment. The device includes a first acquisition module configured to acquire a noise volume level of current ambient noise using a sound collecting device; a second acquisition module configured to acquire a first volume level of a first current audio signal of a first application using the sound collecting device; a first comparison module configured to compare the first volume level and the noise volume level to obtain a first comparison result; and a first adjustment module configured to adjust the first volume level based on at least information associated with the first comparison result and a reference volume level.

According to yet another embodiment, a non-transitory computer readable storage medium includes programming instructions for audio volume adjustment. The programming instructions are configured to cause one or more data processors to execute certain operations. For example, a noise volume level of current ambient noise and a first volume level of a first current audio signal of a first application are acquired using a sound collecting device; the first volume level and the noise volume level are compared to obtain a first comparison result; and the first volume level is adjusted based on at least information associated with the first comparison result and a reference volume level.

Depending upon embodiment, one or more benefits may be achieved. These benefits and various additional objects, features and advantages of the present invention can be fully appreciated with reference to the detailed description and accompanying drawings that follow.

DETAILED DESCRIPTION OF THE INVENTION

Figure 1:
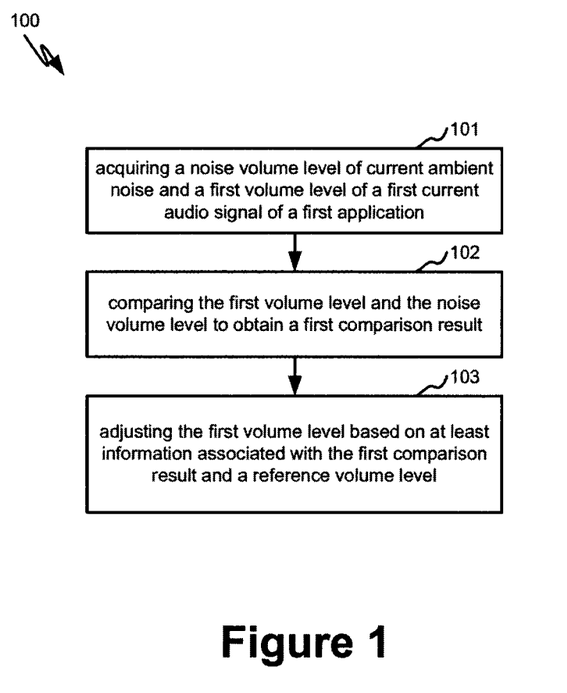
FIG. 1 is a simplified diagram showing a method for audio volume adjustment according to one embodiment of the present invention.

FIG. 1 is a simplified diagram showing a method for audio volume adjustment according to one embodiment of the present invention. The diagram is merely an example, which should not unduly limit the scope of the claims. One of ordinary skill in the art would recognize many variations, alternatives, and modifications. The method 100 includes at least processes 101-103.

According to one embodiment, the process 101 includes: acquiring a noise volume level of current ambient noise and a first volume level of a first current audio signal of a first application. For example, the process 102 includes: comparing the first volume level and the noise volume level to obtain a first comparison result. In another example, the process 103 includes: adjusting the first volume level based on at least information associated with the first comparison result and a reference volume level.

According to another embodiment, the process 103 further includes: in response to the first volume level being higher than the noise volume level, decreasing the first volume level according to the reference volume level. For example, the process 103 further includes: in response to the first volume level being higher than the noise volume level, increasing the first volume level according to the reference volume level. In another example, the process 103 further includes: in response to the first volume level being lower than the noise volume level, increasing the first volume level according to the reference volume level.

According to yet another embodiment, the method 100 further includes: acquiring a user volume level from manual adjustment of a user (e.g., after the first volume level is adjusted according to the first comparison result), and further adjusting the first volume level based on at least information associated with the user volume level. For example, the method 100 further includes: if the first application is switched to a second application, acquiring a second volume level of a previous audio signal of the second application (e.g., after the first volume level is adjusted); comparing the second volume level with the adjusted first volume level to achieve a second comparison result; and adjusting a third volume level of a second current audio signal of the second application based on at least information associated with the second comparison result.

In one embodiment, the process for adjusting a third volume level of a second current audio signal of the second application based on at least information associated with the second comparison result includes: in response to the second volume level being higher than the adjusted first volume level, increasing the third volume level according to the second volume level. For example, the process for adjusting a third volume level of a second current audio signal of the second application based on at least information associated with the second comparison result includes: in response to the second volume level being lower than the adjusted first volume level, decreasing the third volume level according to the second volume level.

In another embodiment, the method 100 further includes: acquiring a user volume level from manual adjustment of a user (e.g., after the third volume level is adjusted according to the second comparison result); and further adjusting the third volume level according to the user volume level.

According to some embodiments, volume levels of the current ambient noise and the current audio signal of the first application are acquired and compared. For example, the volume level of the playing audio of the first application is adjusted according to the comparison result and the reference volume, and thus the volume of the playing audio of the application is automatically adjusted according to variations of external environments so as to provide more convenience and flexibility. In some embodiments, the first application corresponds to any application with an audio playing function, such as a music player, a video player and a game application with a sound playing function.

Figure 2:
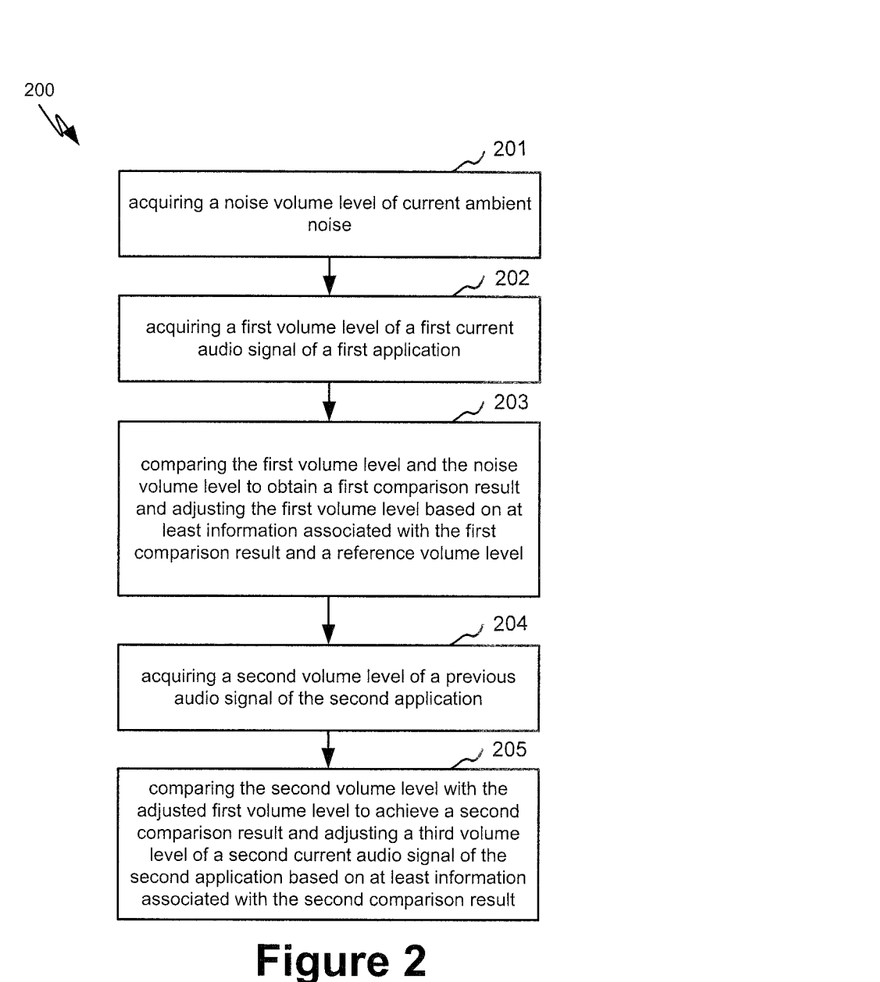
FIG. 2 is a simplified diagram showing a method for audio volume adjustment according to another embodiment of the present invention.

FIG. 2 is a simplified diagram showing a method for audio volume adjustment according to another embodiment of the present invention. The diagram is merely an example, which should not unduly limit the scope of the claims. One of ordinary skill in the art would recognize many variations, alternatives, and modifications. The method 200 includes at least processes 201-205.

According to one embodiment, the process 201 includes: acquiring a noise volume level of current ambient noise. For example, in order to automatically adjust volume levels of a playing audio of a first application according to variations of external environments, the noise volume level of the current ambient noise is acquired for audio volume adjustment. As an example, a current ambient noise is detected. Noise volume levels of the current ambient noise are analyzed and recorded by using decibel (dB) as a unit. In another example, the current ambient noise is detected through a microphone, or other suitable devices. The volume levels of the current ambient noise are analyzed through a decibel meter or other suitable devices.

According to another embodiment, the process 202 includes: acquiring a first volume level of a first current audio signal of a first application. For example, the first volume level of the current audio signal of the first application is acquired as the basis for any audio volume adjustments of the first application. As an example, the first volume level of the current audio signal of the first application is acquired similarly as the noise volume level of the current ambient noise, as described in the process 201. The noise volume level of the current ambient noise is acquired before the acquisition of the first volume level of the current audio signal of the first application, in some embodiments. The noise volume level of the current ambient noise is acquired after the acquisition of the first volume level of the current audio signal of the first application, in certain embodiments. The noise volume level of the current ambient noise is acquired simultaneously as the acquisition of the first volume level of the current audio signal of the first application, in some embodiments.

According to yet another embodiment, the process 203 includes: comparing the first volume level and the noise volume level to obtain a first comparison result; and adjusting the first volume level based on at least information associated with the first comparison result and a reference volume level. For example, the obtained first comparison result indicates that the first volume level of the current audio signal of the first application is higher than the noise volume level of the current ambient noise. In another example, the first volume level of the current audio signal of the first application is lower than the noise volume level of the current ambient noise. In yet another example, in order for the adjusted first volume level of the current audio signal of the first application to satisfy the needs of a user in a current environment and to realize adaptive intelligent adjustment of the volume level according to the current environment and the user needs, the first volume level of the current audio signal of the first application is adjusted according to the first comparison result and the reference volume level.

In one embodiment, the reference volume level may be set according to a volume level usually used by the user in the current environment, or according to a volume level of a previous audio signal of the first application in the current environment. For example, in order to satisfy user needs in the current environment, the set reference volume level is generally higher than the ambient noise volume level of the current environment. As an example, if the ambient noise volume level of the current environment is 15 dB and the volume commonly used by the user in the current environment or the volume of the previous audio signal of the first application in the current environment is 20 dB, the reference volume level may be set as 20 dB.

In some embodiments, different ambient noises have different effects on the volume of the playing audio of the first application. For example, the ambient noise is higher in a noisy environment and thus has larger influence on the volume of the playing audio of the first application, and the user experience may be improved using higher volume of the playing audio of the first application during this time. In another example, the ambient noise is lower in a quiet environment and thus has smaller influence on the volume of the playing audio of the first application than the ambient noise in the noisy environment, and the volume of the playing audio of the first application may be lower than the volume of the playing audio of the first application in the noisy environment. In certain embodiments, to enhance the user experience and for the volume level of the playing audio of the first application to satisfy the user needs in different environments, the first volume level of the current audio signal of the first application is adjusted according to the first comparison result and the reference volume.

According to one embodiment, the first volume level of the current audio signal of the first application is turned down according to the reference volume level if the first comparison result indicates that the first volume level of the current audio signal of the first application is higher than the noise volume level of the current ambient noise. As an example, the user can clearly listen to the current audio signal of the first application in the current environment. If the first volume level of the current audio signal of the first application is higher than the reference volume, the reference volume level may be set according to a volume level usually used by the user in the current environment or according to a volume level of the previous audio signal of the first application in the current environment. That is, the reference volume level meets the user needs. To ensure the user can listen to the current audio signal of the first application clearly in the current environment and to satisfy the user needs better, the first volume level of the current audio signal of the first application is turned down according to the reference volume level when the first volume level of the current audio signal of the first application is higher than the noise volume level of the current ambient noise and the reference volume, in some embodiments. For example, a numerical value of the decrease of the first volume level of the current audio signal of the first application according to the reference volume level may be determined as follows: the first volume level, prior to adjustment, of the current audio signal of the first application is $a1$, the reference volume level is $b1$, and the current ambient noise is $c1$. The adjusted first volume level of the current audio signal of the first application may be any numerical value between $a1$ and $2b1-a1$, provided that $b1$ is greater than $c1$, $a1$ is greater than $c1$ and $a1$ is greater than $b1$. In another example, the first volume level of the current audio signal of the first application is 25 dB, the noise volume level of the current ambient noise is 20 dB, and the reference volume level is 23 dB. The user can listen to the current audio signal of the first application clearly in the current environment since the first volume level (e.g., 25 dB) of the current audio signal of the first application is higher than the noise volume level (e.g., 20 dB) of the current ambient noise. Since the first volume level (e.g., 25 dB) of the current audio signal of the first application is higher than the reference volume level (e.g., 23 dB), in order to meet the user listening needs in the current environment, the first volume level of the current audio signal of the first application is turned down, e.g., by 1 dB, so that the adjusted first volume level of the current audio signal of the first application is 24 dB, according to certain embodiments.

According to another embodiment, the first volume level of the current audio signal of the first application is turned up according to the reference volume level if the first comparison result indicates that the first volume level of the current audio signal of the first application is higher than the noise volume level of the current ambient noise. The user can listen to the current audio signal of the first application clearly in the current environment. In one example, the first volume level of the current audio signal of the first application is higher than the noise volume level of the current ambient noise and is lower than the reference volume. The first volume level of the current audio signal of the first application is turned up according to the reference volume. As an example, a numerical value of the decrease of the first volume level of the current audio signal of the first application according to the reference volume level may be determined as follows: the first volume level, prior to adjustment, of the current audio signal of the first application is $a2$, the reference volume level is $b2$, and the current ambient noise is $c2$. The adjusted first volume level of the current audio signal of the first application may be any numerical value between $a2$ and $c2$, provided that $b2$ is greater than $c2$, $a2$ is greater than $c2$ and $a2$ is smaller than $b2$, according to some embodiments. For instance, the first volume level of the current audio signal of the first application is 23 dB, the noise volume level of the current ambient noise is 20 dB, and a volume level usually used by the user in the current environment is 25 dB. The user can listen to the current audio signal of the first application clearly in the current environment since the first volume level (e.g., 23 dB) of the current audio signal of the first application is higher than the noise volume level (e.g., 20 dB) of the current ambient noise. Since the first volume level (e.g., 23 dB) of the current audio signal of the first application is lower than the reference volume (e.g., 25 dB), in order to meet the listening needs of the user in the current environment, the first volume level of the current audio signal of the first application is turned up (e.g., by 1 dB), so that the adjusted first volume level of the current audio signal of the first application is 24 dB, according to certain embodiments.

According to yet another embodiment, the first volume level of the current audio signal of the first application is turned up according to a second reference volume level if the first comparison result indicates that the first volume level of the current audio signal of the first application is lower than the noise volume level of the current ambient noise. For example, the user is unable to listen to the current audio signal of the first application clearly in the current environment, and thus the first volume level of the current audio signal of the first application needs to be turned up so that the user can listen to the current audio signal of the first application clearly in the current environment. To ensure the user can listen to the current audio signal of the first application clearly in the current environment and to meet the listening needs of the user better, the first volume level of the current audio signal of the first application is turned up according to the reference volume level when the first volume level of the current audio signal of the first application is lower than the noise volume level of the current ambient noise. As an example, a numerical value of the first volume level of the current audio signal of the first application which is turned up according to the reference volume level determined as follows. For example, the first volume level, prior to adjustment, of the current audio signal of the first application is $a3$, the reference volume level is $b3$, and the current ambient noise is $c3$. The adjusted first volume level of the current audio signal of the first application may be any numerical value between $c3$ and $b3$ provided that $b3$ is greater than $c3$ and $a3$ is smaller than $c3$, according to certain embodiments. For instance, the first volume level of the current audio signal of the first application is 20 dB, the noise volume level of the current ambient noise is 23 dB, and the volume commonly used by the user in the current environment is 25 dB. The user is unable to clearly listen to the current audio signal of the first application in the current environment since the first volume level (e.g., 20 dB) of the current audio signal of the first application is lower than the noise volume level (e.g., 23 dB) of the current ambient noise. For example, the first volume level of the current audio signal of the first application needs to be turned up. To enable that the user can listen to the current audio signal of the first application clearly in the current environment, the first volume level of the current audio signal of the first application needs to be not lower than 23 dB, in some embodiments. That is, the first volume level of the current audio signal of the first application needs to increase by at least 3 dB. Further, in order to meet the listening needs of the user in the current environment, the adjusted first volume level of the current audio signal of the first application is lower than the reference volume, and thus the first volume level of the current audio signal of the first application may be turned up (e.g., by 4 dB), so that the adjusted first volume level of the current audio signal of the first application is 24 dB, according to certain embodiments.

In some embodiments, after the first volume level of the current audio signal of the first application is adjusted, the first volume level of the current audio signal of the first application is approximately close to the volume the user needs in the current environment. For example, if the user is not satisfied with the adjusted first volume level of the current audio of the first application, or due to other situations where the user needs to adjust the volume manually, the first volume level can be further adjusted according to at least processes 1 and 2.

In one embodiment, the process 1 includes: acquiring a user volume level from manual adjustment of a user. For example, the user volume level manually adjusted by the user corresponds to the volume level related to a volume control key or a volume control bar when the user presses the volume control key or the volume control bar manually. As an example, the user volume level is acquired through collecting data of the volume control key or the volume control bar after a pressing action of the volume control key or the volume control bar is detected.

In another embodiment, the process 2 includes: adjusting the first volume level based on at least information associated with the user volume level. For example, if the acquired user volume level is higher than the adjusted first volume level of the current audio of the first application, the adjusted first volume level of the current audio signal of the first application is turned up according to the acquired user volume level. In another example, if the acquired user volume level is lower than the adjusted first volume level of the current audio of the first application, the adjusted first volume level of the current audio signal of the first application is turned down according to the acquired user volume level. As an example, a numerical value of the adjusted first volume level of the current audio signal of the first application which is turned up or down according to the user volume level may be consistent with the acquired user volume level.

In some embodiments, if the user has different listening needs on volume levels of playing audios of different applications, when the first application is switched to the second application and the volume of the playing audio of the second application is adjusted using the first volume level of the playing audio of the first application, the different listening needs of the user with respect to different applications may not be met. The method 200 further includes the processes 204-205 for audio volume adjustments when the first application is switched to the second application.

According to one embodiment, the process 204 includes: in response to switching from the first application to a second application, acquiring a second volume level of a previous audio signal of the second application. For example, a second volume level of the previous audio signal of the second application may meet the listening needs of the user. As an example, the second volume level of the previous audio signal of the second application is used as a basis for regulating the third volume level of the current audio of the second application so as to satisfy the listening needs of the user after the first application is switched to the second application. The second volume level of the previous audio signal of the second application is acquired through recording the volume of each playing audio of each application, or any other suitable processes, according to certain embodiments.

According to another embodiment, the process 205 includes: comparing the second volume level with the adjusted first volume level to achieve a second comparison result; and adjusting a third volume level of a second current audio signal of the second application based on at least information associated with the second comparison result. For example, the second volume level of the previous audio signal of the second application is higher than the adjusted first volume level of the current audio signal of the first application. In another example, the second volume level of the previous audio signal of the second application is lower than the adjusted first volume level of the current audio of the first application. In yet another example, to enable the adjusted third volume of the current audio of the second application satisfies the listening needs of the user in a current environment and to realize adaptive intelligent adjustment of the volume according to the current environment and the user needs, the third volume level of the current audio of the second application is adjusted according to the second comparison result.

In one embodiment, if the second comparison result indicates that the second volume level of the previous audio signal of the second application is higher than the adjusted first volume level of the current audio of the first application, the third volume level of the current audio of the second application is turned up according to the second volume level of the previous audio signal of the second application. For example, after the first application is switched to the second application and before the third volume level of the current audio of the second application is adjusted, the third volume level of the current audio of the second application corresponds to the adjusted first volume level of the current audio of the first application. The adjusted first volume level of the current audio signal of the first application enables the user to listen to the audio clearly, and thus if the third volume level of the current audio of the second application corresponds to the adjusted first volume level of the current audio of the first application, the third volume level of the current audio of the second application may meet the listening needs of the user, for example. Considering that the second volume level of the previous audio signal of the second application is accepted by the user, in order to meet the listening needs of the user better, the third volume level of the current audio of the second application is turned up according to the second volume level of the previous audio signal of the second application when the second comparison result indicates that the second volume level of the previous audio signal of the second application is higher than the adjusted first volume level of the current audio of the first application, according to some embodiments. For example, a numerical value of the third volume level of the current audio of the second application which is turned up according to the second volume level of the previous audio signal of the second application is determined as follows. The second volume level of the previous audio signal of the second application is a4, and the adjusted first volume level of the current audio signal of the first application is b4. The adjusted third volume level of the current audio of the second application may be any numerical value between 2a4-b4 and b4 provided that a4 is greater than b4, according to certain embodiments. For instance, the second volume level of the previous audio signal of the second application is 25 dB, and the adjusted first volume level of the current audio signal of the first application is 20 dB. The third volume level of the current audio of the second application is also 20 dB after the first application is switched to the second application. Since the second volume level (e.g., 25 dB) of the previous audio signal of the second application is higher than the first volume level (e.g., 20 dB) of the current audio of the first application, the third volume level of the current audio of the second application is turned up (e.g., by 4 dB), so that the adjusted third volume level of the current audio of the second application is 24 dB, according to some embodiments.

In another embodiment, if the second comparison result indicates that the second volume level of the previous audio signal of the second application is lower than the adjusted first volume level of the current audio of the first application, the third volume level of the current audio of the second application is turned down according to the second volume level of the previous audio signal of the second application. For example, after the first application is switched to the second application and before the third volume level of the current audio of the second application is adjusted, the third volume level of the current audio of the second application corresponds to the adjusted first volume level of the current audio of the first application. The adjusted first volume level of the current audio signal of the first application enables the user to listen to the audio clearly, in some embodiments. If the third volume level of the current audio of the second application is the adjusted first volume level of the current audio of the first application, the third volume level of the current audio of the second application may meet the listening needs of the user. Considering that the second volume level of the previous audio signal of the second application is accepted by the user, in order to meet the listening needs of the user better, the third volume level of the current audio of the second application is turned down according to the second volume level of the previous audio signal of the second application when the second comparison result indicates that the second volume level of the previous audio signal of the second application is lower than the adjusted first volume level of the current audio of the first application, according to some embodiments. For example, a numerical value of the third volume level of the current audio of the second application which is turned down according to the second volume level of the previous audio signal of the second application is determined as follows. The second volume level of the previous audio signal of the second application is a5, and the adjusted first volume level of the current audio signal of the first application is b5. The adjusted third volume level of the current audio of the second application may be any numerical value between 2a5-b5 and b5 provided that a5 is smaller than b5, according to certain embodiments. For instance, if the second volume level of the previous audio signal of the second application is 20 dB, and the adjusted first volume level of the current audio signal of the first application is 25 dB. The third volume level of the current audio of the second application is also 25 dB after the first application is switched to the second application. Since the second volume level (e.g., 20 dB) of the previous audio signal of the second application is lower than the adjusted first volume level (e.g., 25 dB) of the current audio of the first application, the third volume level of the current audio of the second application is turned up (e.g., by 4 dB), so that the adjusted third volume level of the current audio of the second application is 21 dB.

In some embodiments, after the third volume level of the current audio of the second application is adjusted, the third volume level of the current audio of the second application is approximately close to the volume required by the user in the current environment. If the user is not satisfied with the regulated volume of the current audio of the second application, or due to other situations where the user needs to adjust the volume manually, the third volume level may be further adjusted according to at least processes 1 and 2.

In one embodiment, the process 1 includes: acquiring a user volume level from manual adjustment of a user. For example, the user volume level corresponds to a volume level related to a volume control key or a volume control bar when the user manually presses the volume control key or the volume control bar. The user volume level is acquired through collecting data of the volume control key or the volume control bar after a pressing action of the volume control key or the volume control bar is detected.

In another embodiment, the process 2 includes: adjusting the third volume level according to the user volume level. For example, if the acquired user volume level is higher than the adjusted third volume level of the current audio of the second application, the adjusted third volume level of the current audio of the second application is turned up according to the acquired user volume level. In another example, if the acquired user volume level is lower than the adjusted third volume level of the current audio of the second application, the adjusted third volume level of the current audio of the second application is turned down according to the acquired user volume level. In yet another example, a numerical value of the adjusted third volume level of the current audio of the second application which is turned up or down according to the acquired user volume level may be consistent with the acquired user volume level.

In some embodiments, the method 200 is applied when the current environment does not change. In certain embodiments, when the current environment changes, the method 200 is applied similarly to what is described above. For instance, if the current environment is a noisy environment before the volume is adjusted and the current environment changes from the noisy environment into a quiet environment after the volume is adjusted, one or more processes of the method 200 are applied to further adjust the volume.

According to some embodiments, volume levels of the current ambient noise and the current audio signal of the first application are acquired and compared. For example, the volume level of the playing audio of the first application is adjusted according to the comparison result and the reference volume, and thus the volume of the playing audio of the application is automatically adjusted according to variations of external environments so as to provide more convenience and flexibility.

Figure 3:
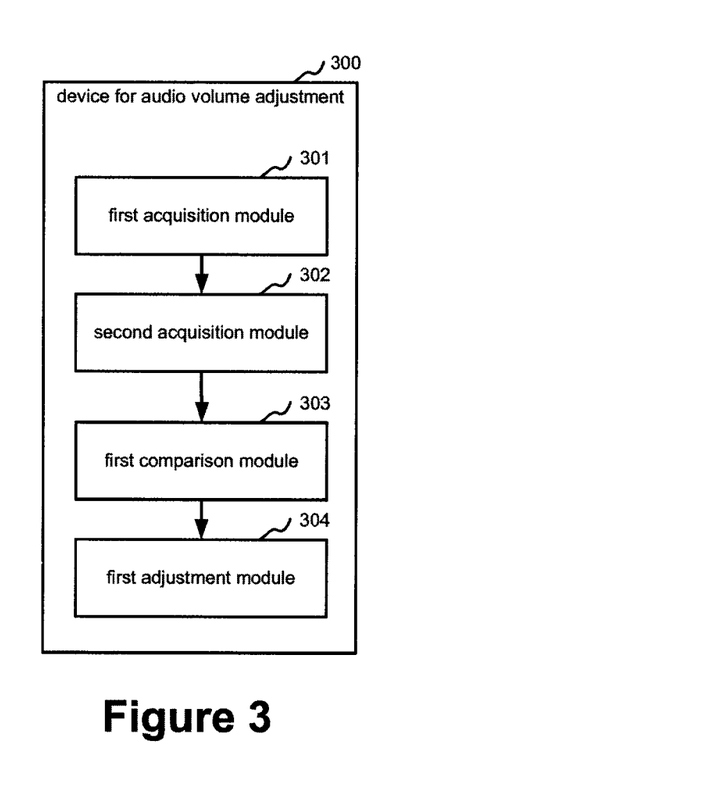
FIG. 3 is a simplified diagram showing a device for audio volume adjustment according to one embodiment of the present invention.

FIG. 3 is a simplified diagram showing a device for audio volume adjustment according to one embodiment of the present invention. The diagram is merely an example, which should not unduly limit the scope of the claims. One of ordinary skill in the art would recognize many variations, alternatives, and modifications. The device 300 includes: a first acquisition module 301, a second acquisition module 302, a first comparison module 303, and a first adjustment module 304.

According to one embodiment, the first acquisition module 301 is configured to acquire a noise volume level of current ambient noise. For example, the second acquisition module 302 is configured to acquire a first volume level of a first current audio signal of a first application. As an example, the first comparison module 303 is configured to compare the first volume level and the noise volume level to obtain a first comparison result. In another example, the first adjustment module 304 is configured to adjust the first volume level based on at least information associated with the first comparison result and a reference volume level.

According to another embodiment, the first adjustment module 304 is further configured to, in response to the first volume level being higher than the noise volume level, decrease the first volume level according to the reference volume level. For example, the first adjustment module 304 is further configured to, in response to the first volume level being higher than the noise volume level, increase the first volume level according to the reference volume level. In another example, the first adjustment module 304 is further configured to, in response to the first volume level being lower than the noise volume level, increase the first volume level according to the reference volume level.

Figure 4:
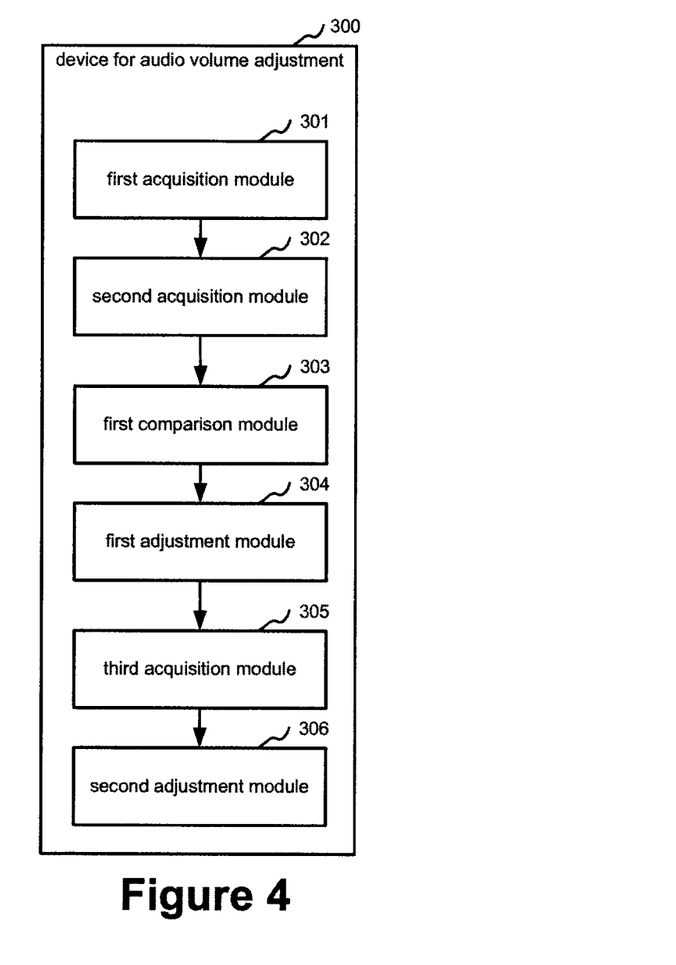
FIG. 4 is a simplified diagram showing a device for audio volume adjustment according to another embodiment of the present invention.

FIG. 4 is a simplified diagram showing a device for audio volume adjustment according to another embodiment of the present invention. The diagram is merely an example, which should not unduly limit the scope of the claims. One of ordinary skill in the art would recognize many variations, alternatives, and modifications. The device 300 further includes: a third acquisition module 305 and a second adjustment module 306.

According to one embodiment, the third acquisition module 305 is configured to acquire a user volume level from manual adjustment of a user. For example, the second adjustment module 306 is configured to adjust the first volume level based on at least information associated with the user volume level.

Figure 5:
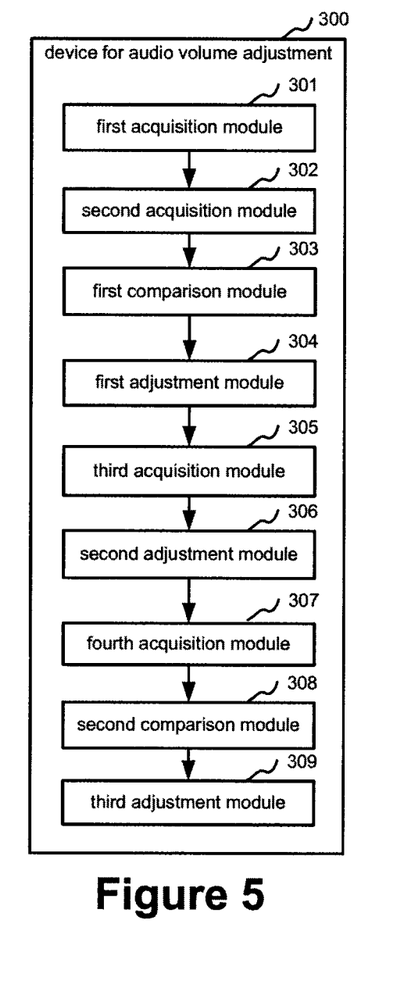
FIG. 5 is a simplified diagram showing a device for audio volume adjustment according to yet another embodiment of the present invention.

FIG. 5 is a simplified diagram showing a device for audio volume adjustment according to yet another embodiment of the present invention. The diagram is merely an example, which should not unduly limit the scope of the claims. One of ordinary skill in the art would recognize many variations, alternatives, and modifications. The device 300 further includes: a fourth acquisition module 307, a second comparison module 308 and a third adjustment module 309.

According to one embodiment, the fourth acquisition module 307 is configured to, in response to switching from the first application to a second application, acquire a second volume level of a previous audio signal of the second application. For example, the second comparison module 308 is configured to compare the second volume level with the adjusted first volume level to achieve a second comparison result. In another example, the third adjustment module 309 configured to adjust a third volume level of a second current audio signal of the second application based on at least information associated with the second comparison result.

According to another embodiment, the third adjustment module 309 is further configured to, in response to the second volume level being higher than the adjusted first volume level, increase the third volume level according to the second volume level. For example, the third adjustment module 309 is further configured to, in response to the second volume level being lower than the adjusted first volume level, decrease the third volume level according to the second volume level.

Figure 6:
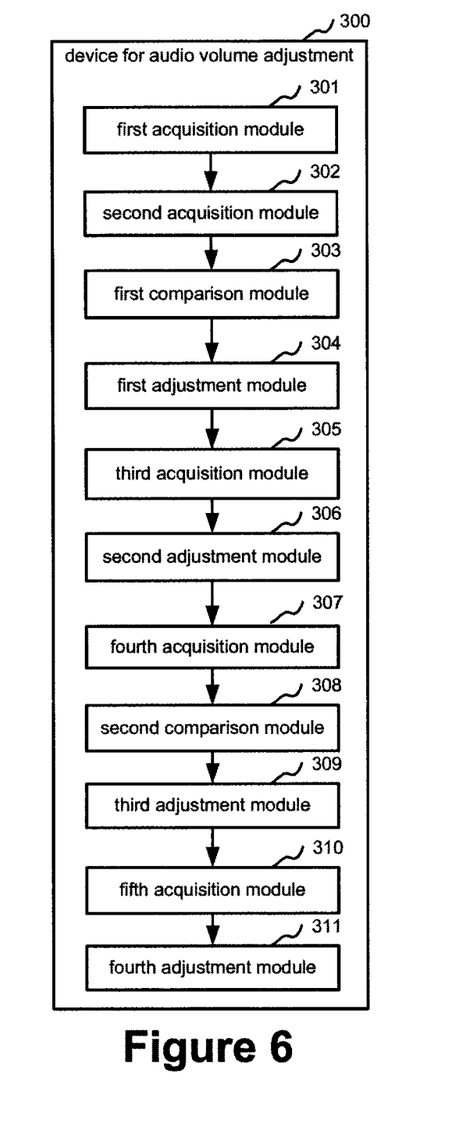
FIG. 6 is a simplified diagram showing a device for audio volume adjustment according to yet another embodiment of the present invention.

FIG. 6 is a simplified diagram showing a device for audio volume adjustment according to yet another embodiment of the present invention. The diagram is merely an example, which should not unduly limit the scope of the claims. One of ordinary skill in the art would recognize many variations, alternatives, and modifications. The device 300 further includes: a fifth acquisition module 310, and a fourth adjustment module 311.

According to one embodiment, the fifth acquisition module 310 is configured to acquire a user volume level from manual adjustment of a user. For example, the fourth adjustment module 311 is configured to adjust the third volume level according to the user volume level.

Figure 7:
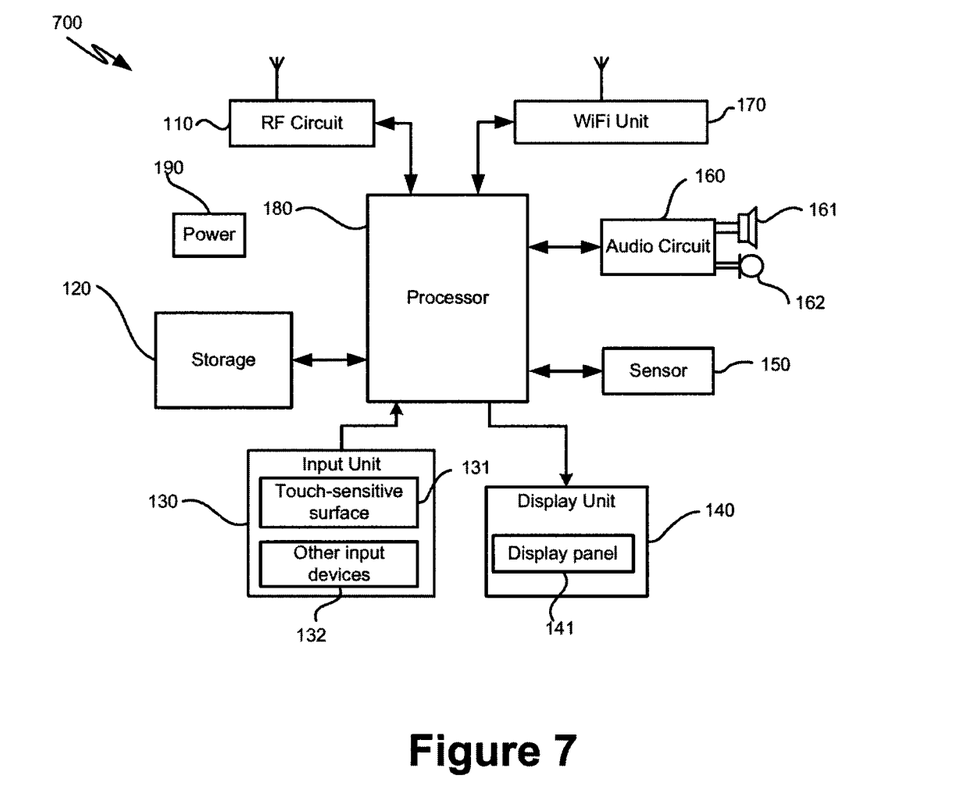
FIG. 7 is a simplified diagram showing a terminal for audio volume adjustments according to one embodiment of the present invention.

FIG. 7 is a simplified diagram showing a terminal for audio volume adjustments according to one embodiment of the present invention. The diagram is merely an example, which should not unduly limit the scope of the claims. One of ordinary skill in the art would recognize many variations, alternatives, and modifications.

According to one embodiment, the terminal 700 includes a RF (i.e., radio frequency) circuit 110, a memory 120 that includes one or more computer-readable storage media, an input unit 130, a display unit 140, a sensor 150, an audio circuit 160, a wireless communication module 170 (e.g., a WiFi module), one or more processors 180 that includes one or more processing cores, and a power supply 190. For example, the RF circuit 110 is configured to send/receive messages or signals in communication. As an example, the RF circuit 110 receives a base station's downlink information, delivers to the processors 180 for processing, and sends uplink data to the base station. For example, the RF circuit 110 includes an antenna, at least one amplifier, a tuner, one or several oscillators, SIM (Subscriber Identity Module) card, a transceiver, a coupler, an LNA (Low Noise Amplifier) and/or a duplexer. In another example, the RF circuit 110 communicates with the network and other equipments via wireless communication based on any communication standard or protocols, such as GSM (Global System of Mobile communication), GPRS (General Packet Radio Service), CDMA (Code Division Multiple Access), WCDMA (Wideband Code Division Multiple Access), LTE (Long Term Evolution), email, SMS (Short Messaging Service), etc.

According to another embodiment, the memory 120 is configured to store software programs and modules. For example, the processors 180 are configured to execute various functional applications and data processing by running the software programs and modules stored in the memory 120. The memory 120 includes a program storage area and a data storage area, where the program storage area may store the operating system, and the application(s) required by one or more functions (e.g., an audio player or a video player), in some embodiments. For example, the data storage area stores the data created based on the use of the terminal 700 (e.g., audio data or a phone book). In another example, the memory 120 includes a high-speed random access storage, a non-volatile memory, one or more floppy disc storage devices, a flash storage device or other volatile solid storage devices. As an example, the memory 120 further includes a memory controller to enable access to the memory 120 by the processors 180 and the input unit 130.

According to yet another embodiment, the input unit 130 is configured to receive an input number or character data and generate inputs for a keyboard, a mouse, and a joystick, optical or track signals relating to user setting and functional control. For example, the input unit 130 includes a touch-sensitive surface 131 and other input devices 132. The touch-sensitive surface 131 (e.g., a touch screen or a touch panel) is configured to receive the user's touch operations thereon or nearby (e.g., the user's operations on or near the touch-sensitive surface with a finger, a touch pen or any other appropriate object or attachment) and drive the corresponding connected devices according to the predetermined program. For example, the touch-sensitive surface 131 includes two parts, namely a touch detector and a touch controller. The touch detector detects the position of user touch and the signals arising from such touches and sends the signals to the touch controller. The touch controller receives touch data from the touch detector, converts the touch data into the coordinates of the touch point, sends the coordinates to the processors 180 and receives and executes the commands received from the processors 180. For example, the touch-sensitive surface 131 is of a resistance type, a capacitance type, an infrared type and a surface acoustic wave type. In another example, other than the touch-sensitive surface, the input unit 130 includes the other input devices 132. For example, the other input devices 132 include one or more physical keyboards, one or more functional keys (e.g., volume control keys or switch keys), a track ball, a mouse and/or a joystick.

According to yet another embodiment, the display unit 140 is configured to display data input from a user or provided to the user, and includes various graphical user interfaces of the terminal 700. For example, these graphical user interfaces include menus, graphs, texts, icons, videos and a combination thereof. The display unit 140 includes a display panel 141 which contains a LCD (liquid crystal display), an OLED (organic light-emitting diode). As an example, the touch-sensitive surface can cover the display panel 141. For example, upon detecting any touch operations thereon or nearby, the touch-sensitive surface sends signals to the processors 180 to determine the type of the touch events and then the processors 180 provides corresponding visual outputs on the display panel 141 according to the type of the touch events. Although the touch-sensitive surface 131 and the display panel 141 are two independent parts for input and output respectively, the touch-sensitive surface 131 and the display panel 141 can be integrated for input and output, in some embodiments.

In one embodiment, the terminal 700 includes a sensor 150 (e.g., an optical sensor, a motion sensor or other sensors). For example, the sensor 150 includes an environment optical sensor and adjusts the brightness of the display panel 141 according to the environmental luminance. In another example, the sensor 150 includes a proximity sensor and turns off or backlights the display panel when the terminal 700 moves close to an ear of a user. In yet another example, the sensor 150 includes a motion sensor (e.g., a gravity acceleration sensor) and detects a magnitude of acceleration in all directions (e.g., three axes). Particularly, the sensor 150 detects a magnitude and a direction of gravity when staying still. In some embodiments, the sensor 150 is used for identifying movements of a cell phone (e.g., a switch of screen direction between horizontal and vertical, related games, and a calibration related to a magnetometer) and features related to vibration identification (e.g., a pedometer or a strike). In certain embodiments, the sensor 150 includes a gyroscope, a barometer, a hygroscope, a thermometer and/or an infrared sensor.

In another embodiment, the audio circuit 160, a speaker 161, and a microphone 162 are configured to provide an audio interface between a user and the terminal 700. For example, the audio circuit 160 is configured to transmit electrical signals converted from certain audio data to the speaker that converts such electrical signals into some output audio signals. In another example, the microphone 162 is configured to convert audio signals into electrical signals which are converted into audio data by the audio circuit 160. The audio data are processed in the processors 180 and received by the RF circuit 110 before being sent to another terminal, in some embodiments. For example, the audio data are output to the memory 120 for further processing. As an example, the audio circuit 160 includes an earphone jack for communication between a peripheral earphone and the terminal 700.

According to some embodiments, the wireless communication module 170 includes a WiFi (e.g., wireless fidelity, a short-distance wireless transmission technology) module, a Bluetooth module, an infrared communication module, etc. In some embodiments, through the wireless communication module 170, the terminal 700 enables the user to receive and send emails, browse webpages, and/or access stream media. For example, the terminal 700 is configured to provide the user with a wireless broadband Internet access. In some embodiments, the wireless communication module 170 is omitted in the terminal 700.

According to one embodiment, the processors 180 are the control center of the terminal 700. For example, the processors 180 is connected to various parts of the terminal 700 (e.g., a cell phone) via various interfaces and circuits, and executes various features of the terminal 700 and processes various data through operating or executing the software programs and/or modules stored in the memory 120 and calling the data stored in the memory 120, so as to monitor and control the terminal 700 (e.g., a cell phone). As an example, the processors 180 include one or more processing cores. In another example, the processors 180 is integrated with an application processor and a modem processor, where the application processor mainly handles the operating system, the user interface and the applications and the modem processor mainly handles wireless communications. In some embodiments, the modem processor is not integrated into the processors 180.

According to another embodiment, the terminal 700 includes the power supply 190 (e.g., a battery) that powers up various parts. For example, the power supply 190 is logically connected to the processors 180 via a power source management system so that the charging, discharging and power consumption can be managed via the power source management system. In another example, the power supply 190 includes one or more DC or AC power sources, a recharging system, a power-failure-detection circuit, a power converter, an inverter, a power source state indicator, or other components. In yet another example, the terminal 700 includes a camcorder, a Bluetooth module, etc. Specifically, the processors 180 of the terminal 700 load executable files/codes associated with one or more applications to the memory 120 and run the applications stored in the memory 120 according to the method 100 as shown in FIG. 1 and the method 200 as shown in FIG. 2.

According to yet another embodiment, a method is provided for audio volume adjustment. For example, a noise volume level of current ambient noise and a first volume level of a first current audio signal of a first application are acquired using a sound collecting device. The first volume level and the noise volume level are compared using one or more data processors to obtain a first comparison result. The first volume level is adjusted based on at least information associated with the first comparison result and a reference volume level. For example, the method is implemented according to at least FIG. 1 and/or FIG. 2.

According to another embodiment, a device is provided for audio volume adjustment. The device includes a first acquisition module configured to acquire a noise volume level of current ambient noise using a sound collecting device; a second acquisition module configured to acquire a first volume level of a first current audio signal of a first application using the sound collecting device; a first comparison module configured to compare the first volume level and the noise volume level to obtain a first comparison result; and a first adjustment module configured to adjust the first volume level based on at least information associated with the first comparison result and a reference volume level. For example, the device is implemented according to at least FIG. 3, FIG. 4, FIG. 5, and/or FIG. 6.

According to yet another embodiment, a non-transitory computer readable storage medium includes programming instructions for audio volume adjustment. The programming instructions are configured to cause one or more data processors to execute certain operations. For example, a noise volume level of current ambient noise and a first volume level of a first current audio signal of a first application are acquired using a sound collecting device; the first volume level and the noise volume level are compared to obtain a first comparison result; and the first volume level is adjusted based on at least information associated with the first comparison result and a reference volume level. For example, the storage medium is implemented according to at least FIG. 1 and/or FIG. 2.

The above only describes several scenarios presented by this invention, and the description is relatively specific and detailed, yet it cannot therefore be understood as limiting the scope of this invention. It should be noted that ordinary technicians in the field may also, without deviating from the invention's conceptual premises, make a number of variations and modifications, which are all within the scope of this invention. As a result, in terms of protection, the patent claims shall prevail.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to perform the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein. The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include client devices and servers. A client device and server are generally remote from each other and typically interact through a communication network. The relationship of client device and server arises by virtue of computer programs running on the respective computers and having a client device-server relationship to each other.

This specification contains many specifics for particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be removed from the combination, and a combination may, for example, be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present invention have been described, it is understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A processor-implemented method for audio volume adjustment, comprising:
    acquiring, using a sound collecting device, a noise volume level of current ambient noise and a first volume level of a first current audio signal of a first application;
    comparing, using one or more data processors, the first volume level and the noise volume level to obtain a first comparison result;
    adjusting the first volume level based on at least information associated with the first comparison result and a reference volume level;
    in response to switching from the first application to a second application, acquiring a second volume level of a previous audio signal of the second application;
    comparing the second volume level with the adjusted first volume level to achieve a second comparison result; and
    adjusting a third volume level of a second current audio signal of the second application based on at least information associated with the second comparison result.

2. The method of claim 1, wherein the adjusting a third volume level of a second current audio signal of the second application based on at least information associated with the second comparison result includes:
    in response to the second volume level being higher than the adjusted first volume level, increasing the third volume level according to the second volume level.

3. The method of claim 1, wherein the adjusting a third volume level of a second current audio signal of the second application based on at least information associated with the second comparison result includes:
    in response to the second volume level being lower than the adjusted first volume level, decreasing the third volume level according to the second volume level.

4. The method of claim 1, further comprising:
    acquiring a user volume level from manual adjustment of a user; and
    adjusting the third volume level according to the user volume level.

5. A device for audio volume adjustment, comprising:
    a first acquisition module configured to acquire a noise volume level of current ambient noise using a sound collecting device;
    a second acquisition module configured to acquire a first volume level of a first current audio signal of a first application using the sound collecting device;
    a first comparison module configured to compare the first volume level and the noise volume level to obtain a first comparison result;
    a first adjustment module configured to adjust the first volume level based on at least information associated with the first comparison result and a reference volume level;
    a fourth acquisition module configured to, in response to switching from the first application to a second application, acquire a second volume level of a previous audio signal of the second application;
    a second comparison module configured to compare the second volume level with the adjusted first volume level to achieve a second comparison result; and
    a third adjustment module configured to adjust a third volume level of a second current audio signal of the second application based on at least information associated with the second comparison result.

6. The device of claim 5, wherein the third adjustment module is further configured to, in response to the second volume level being higher than the adjusted first volume level, increase the third volume level according to the second volume level.

7. The device of claim 5, wherein the third adjustment module is further configured to, in response to the second volume level being lower than the adjusted first volume level, decrease the third volume level according to the second volume level.

8. The device of claim 5, further comprising:
    a fifth acquisition module configured to acquire a user volume level from manual adjustment of a user; and
    a fourth adjustment module configured to adjust the third volume level according to the user volume level.

* * * * *